United States Patent
Tsai

(10) Patent No.: US 9,743,533 B2
(45) Date of Patent: Aug. 22, 2017

(54) METHOD FOR MANUFACTURING RIGID-FLEXIBLE PRINTED CIRCUIT BOARD

(71) Applicant: GARUDA TECHNOLOGY CO., LTD., New Taipei (TW)

(72) Inventor: Hsien-Ming Tsai, Taoyuan (TW)

(73) Assignee: GARUDA TECHNOLOGY CO., LTD, New Taipei (TW)

( * ) Notice: Subject to any disclaimer, the term of this patent is extended or adjusted under 35 U.S.C. 154(b) by 66 days.

(21) Appl. No.: 14/512,556

(22) Filed: Oct. 13, 2014

(65) Prior Publication Data
US 2015/0101847 A1 Apr. 16, 2015

(30) Foreign Application Priority Data
Oct. 12, 2013 (CN) .......................... 2013 1 0474200

(51) Int. Cl.
*H05K 3/46* (2006.01)
*H05K 1/14* (2006.01)

(52) U.S. Cl.
CPC ........... *H05K 3/4691* (2013.01); *H05K 1/147* (2013.01); *Y10T 156/10* (2015.01)

(58) Field of Classification Search
CPC ...... H05K 1/028; H05K 1/0278; H05K 1/147; H05K 1/4691; Y10T 156/10
See application file for complete search history.

(56) References Cited

U.S. PATENT DOCUMENTS

| 5,095,628 | A | * | 3/1992 | McKenney | H05K 3/4691 156/289 |
| 5,175,047 | A | * | 12/1992 | McKenney | H05K 3/4691 174/250 |
| 5,206,463 | A | * | 4/1993 | DeMaso | H05K 3/4691 174/254 |
| 5,262,594 | A | * | 11/1993 | Edwin | H05K 3/3452 174/254 |
| 5,499,444 | A | * | 3/1996 | Doane, Jr. | H05K 3/4691 156/252 |
| 7,663,064 | B2 | * | 2/2010 | Dutta | H05K 1/024 174/255 |
| 2006/0019075 | A1 | * | 1/2006 | Myoung | H05K 3/4691 428/209 |
| 2006/0156542 | A1 | * | 7/2006 | Matsuda | H05K 3/4691 29/846 |

(Continued)

FOREIGN PATENT DOCUMENTS

CN 1809251 A 7/2006

*Primary Examiner* — Carl Arbes
(74) *Attorney, Agent, or Firm* — Steven Reiss

(57) ABSTRACT

A rigid-flexible printed circuit board (PCB) a method for manufacturing the rigid-flexible PCB, and a PCB module having the rigid-flexible PCB are provided. The rigid-flexible printed circuit board (PCB) defines a first area, a second area, and a third area connected in the described order. The rigid-flexible PCB includes a first flexible PCB, a second flexible PCB adhered with the first flexible PCB through a bonding sheet in the third area, and, a first conductive layer and a second conductive layer formed on opposite side of the rigid-flexible PCB in the first area and the third area. The first flexible PCB is apart from the second flexible PCB in the first area and the second area.

7 Claims, 12 Drawing Sheets

(56) References Cited

U.S. PATENT DOCUMENTS

| | | | | |
|---|---|---|---|---|
| 2006/0169485 A1* | 8/2006 | Kawaguchi | .......... | H05K 3/4691 |
| | | | | 174/254 |
| 2006/0193970 A1* | 8/2006 | Myung | .................. | C23C 26/00 |
| | | | | 427/96.1 |
| 2007/0012475 A1* | 1/2007 | Kawaguchi | ............ | H05K 3/361 |
| | | | | 174/255 |
| 2007/0281142 A1* | 12/2007 | Ohta | ..................... | C08F 255/00 |
| | | | | 428/209 |
| 2007/0281505 A1* | 12/2007 | Kobayashi | ........... | H05K 3/4691 |
| | | | | 439/69 |
| 2008/0047737 A1* | 2/2008 | Sahara | .................. | H05K 1/186 |
| | | | | 174/254 |
| 2008/0099230 A1* | 5/2008 | Takahashi | ............ | H05K 3/4691 |
| | | | | 174/250 |
| 2008/0289859 A1* | 11/2008 | Mikado | ................ | H05K 1/0281 |
| | | | | 174/254 |
| 2010/0014265 A1* | 1/2010 | Sagisaka | .............. | H05K 3/4691 |
| | | | | 361/784 |
| 2010/0025086 A1* | 2/2010 | Stahr | .................... | H05K 3/4691 |
| | | | | 174/254 |
| 2010/0084169 A1* | 4/2010 | Nakamura | ............ | H05K 1/028 |
| | | | | 174/254 |
| 2010/0155109 A1* | 6/2010 | Takahashi | .............. | H05K 1/028 |
| | | | | 174/254 |
| 2012/0325524 A1* | 12/2012 | Naganuma | ........... | H05K 3/4691 |
| | | | | 174/254 |

\* cited by examiner

METHOD FOR MANUFACTURING RIGID-FLEXIBLE PRINTED CIRCUIT BOARD

FIELD

The present disclosure relates to a rigid-flexible printed circuit board (PCB) a method for manufacturing the rigid-flexible PCB, and a PCB module having the rigid-flexible PCB.

BACKGROUND

Rigid-flexible PCBs used in electronic devices includes a flexible portion and a rigid portion electrically connected to each other, or, includes two rigid portions and a flexible portion, and two ends of the flexible portion electrically connected respectively to the two rigid portions, and such rigid-flexible PCBs have one or two mounting portions to electrically connect electronic components.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
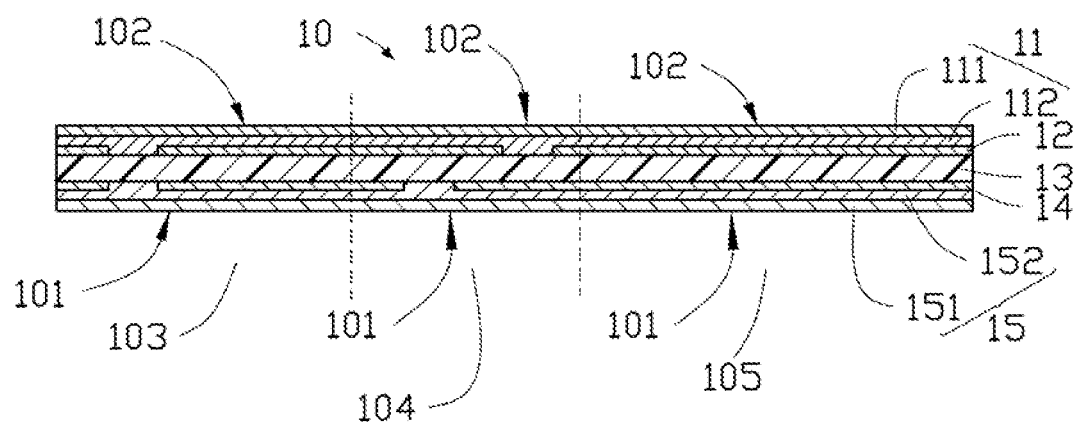
FIG. 1 is a cross-sectional view of a first flexible PCB according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

A method for manufacturing a rigid-flexible printed circuit board includes: providing a first flexible PCB and a second flexible PCB, the first flexible PCB has a first surface and a second surface opposite to, and substantially parallel to, the first surface, the second flexible PCB has a first surface and a second surface opposite to, and substantially parallel to, the first surface, the first flexible PCB defines a first portion, a second portion, and a third portion connected in described order, the second flexible PCB defines a fourth portion, a fifth portion, and a sixth portion connected in described order; proving a bonding sheet having a first surface and a second surface opposite to, and substantially parallel to, the first surface; adhering the first surface of the third portion to the first surface of the bonding sheet, and adhering the first surface of the sixth portion to the second surface of the bonding sheet, the fourth, fifth, and sixth portion of the second flexible PCB are respectively aligned with the first, second, and third portion of the first flexible PCB; and forming a first prepreg sheet and a first conductive layer on the second surface of the first and third portion, and forming a second prepreg sheet and a second conductive layer on the second surface of the fourth and sixth portion, the first prepreg sheet is adhered with the second surface of the first and third portion, the second prepreg sheet is adhered with the second surface of the fourth and sixth portion, the first conductive layers is adhered with a surface of the first prepreg sheet away from the first flexible PCB, the second conductive layers is adhered with a surface of the second prepreg sheet away from the second flexible PCB, thereby, obtaining a rigid-flexible PCB. The first and second portion of the first flexible PCB are respectively separated from the fourth and fifth portion of the second flexible PCB.

A rigid-flexible PCB includes a first flexible PCB having a first surface and a second surface opposite to, and substantially parallel to, the first surface, the first flexible PCB defines a first portion, a second portion, and a third portion connected in described order; a second flexible PCB having a first surface and a second surface opposite to, and substantially parallel to, the first surface, the second flexible PCB defines a fourth portion, a fifth portion, and a sixth portion connected in described order; a bonding sheet having a first surface and a second surface opposite to, and substantially parallel to, the first surface; the first surface of the third portion is adhered to the first surface of the bonding sheet, and the first surface of the sixth portion is adhered to the second surface of the bonding sheet, the fourth, fifth, and sixth portion of the second flexible PCB being separately aligned with the first, second, and third portion of the first flexible PCB; a first prepreg sheet adhered with the second surface of the first and third portion, and a second prepreg sheet adhered with the second surface of the fourth and sixth portion; a first conductive layers being adhered with a surface of the first prepreg sheet away from the first flexible PCB; and a second conductive layers being adhered with a surface of the second prepreg sheet away from the second flexible PCB. The first and second portion of the first flexible circuit board are respectively separated from the fourth and fifth portion of the second printed circuit board.

A PCB module includes a first flexible PCB having a first surface and a second surface opposite to, and substantially parallel to, the first surface, the first flexible PCB defines a first portion, a second portion, and a third portion connected in described order; a second flexible PCB having a first surface and a second surface opposite to, and substantially parallel to, the first surface, the second flexible PCB defines a fourth portion, a fifth portion, and a sixth portion connected in described order; a bonding sheet having a first surface and a second surface opposite to, and substantially parallel to, the first surface, the first surface of the third portion is adhered to the first surface of the bonding sheet, and the first surface of the sixth portion is adhered to the second surface of the bonding sheet, the fourth, fifth, and sixth portion of the second flexible PCB are separately aligned with the first, second, and third portion of the first flexible PCB; a first prepreg sheet adhered with the second surface of the first and third portion, and a second prepreg sheet adhered with the second surface of the fourth and sixth portion; a first conductive layers being adhered with a surface of the first prepreg sheet away from the first flexible PCB; and a second conductive layers being adhered with a surface of the second prepreg sheet away from the second flexible PCB. The first and second portion of the first flexible circuit board are respectively separated from the fourth and fifth portion of the second printed circuit board. The second and the fifth portion are respectively flexed at a right angle, an acute angle, an obtuse angle, or 180 degrees. The first portion, a portion of the first prepeg sheet aligned with the first portion, and a portion of the first conductive layer aligned with the first portion are cooperatively defined to be a first mounting portion, the fourth portion, a portion of the second prepeg sheet aligned with the fourth portion, and a portion of the second conductive layer aligned with the fourth portion are cooperatively defined to be a second mounting portion, the first mounting portion and the second mounting portion electrically connect PCBs, or electronic components.

FIGS. 1-11 illustrate an embodiment of a method for manufacturing a rigid-flexible PCB.

Figure 2:
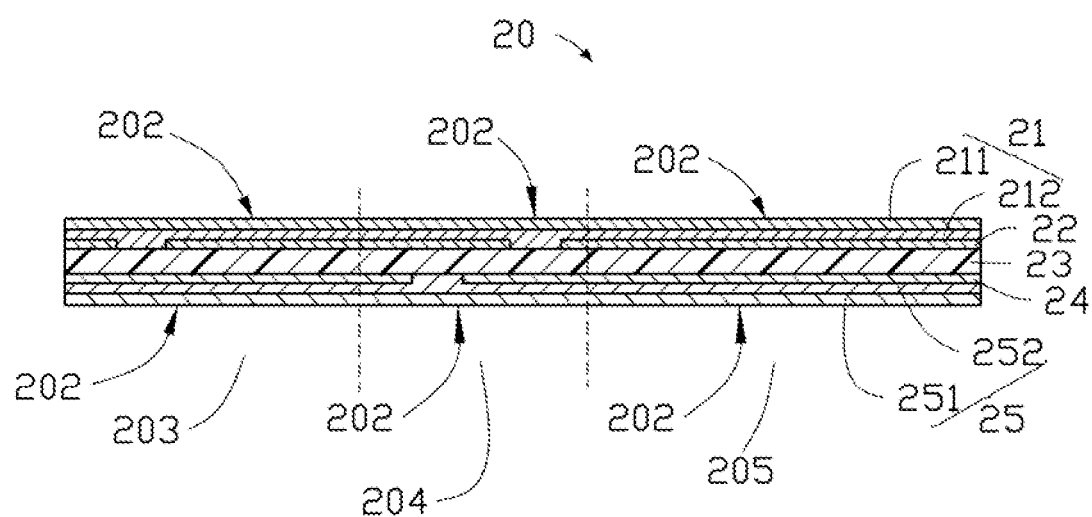
FIG. 2 is a cross-sectional view of a second flexible PCB according to an embodiment.

FIGS. 1-2 illustrate that a first flexible PCB 10 and a second flexible PCB 20 are provided. In this embodiment, the first flexible PCB 10 and the second flexible PCB 20 are all double side PCB. In other embodiments, the first flexible PCB 10 and the second flexible PCB 20 can be single side PCB. The first flexible PCB 10 includes a first surface 101 and a second surface 102 opposite to, and substantially parallel to, the first surface 101. The second flexible PCB 20 includes a first surface 201 and a second surface 202 opposite to, and substantially parallel to, the first surface 201. The first flexible PCB 10 defines a first portion 103, a second portion 104, and a third portion 105 connected in described order. The second flexible PCB 20 defines a fourth portion 203, a fifth portion 204, and a sixth portion 205 connected in described order.

FIG. 1 illustrates that the first flexible PCB 10 includes a first cover layer 11, a third conductive layer 12, a first flexible insulating layer 13, a fourth conductive layer 14, and a second cover layer 15 adhered in described order. The first cover layer 11 includes a first film layer 111 and a first adhesive layer 112. The second cover layer 15 includes a second film layer 151 and a second adhesive layer 152. The first adhesive layer 112 and the second adhesive layer 152 are directly adhered with the conductive layers.

FIG. 2 illustrates that the second flexible PCB 20 includes a third cover layer 21, a fifth conductive layer 22, a second flexible insulating layer 23, a sixth conductive layer 24, and a fourth cover layer 25 adhered in described order. The second flexible PCB 20 is corresponding to the first flexible PCB 10. Size of the second flexible PCB 20 is equal to that of the first flexible PCB 10. The third cover layer 21 includes a third film layer 211 and a third adhesive layer 212. The fourth cover layer 25 includes a fourth film layer 251 and a fourth adhesive layer 252. The third adhesive layer 212 and the fourth adhesive layer 252 are directly adhered with the conductive layers.

The first film layer 111, the first flexible insulating layer 13, the second film layer 151, the third film layer 211, the second flexible insulating layer 23, and the fourth film layer 251 can be made of flexible materials such as polyimide (PI), polyethylene terephtalate (PET), or Polyethylene naphthalate (PEN).

A plurality of conductive holes (not shown) can be defined in the first flexible PCB 10 and the second flexible PCB 20.

Figure 3:
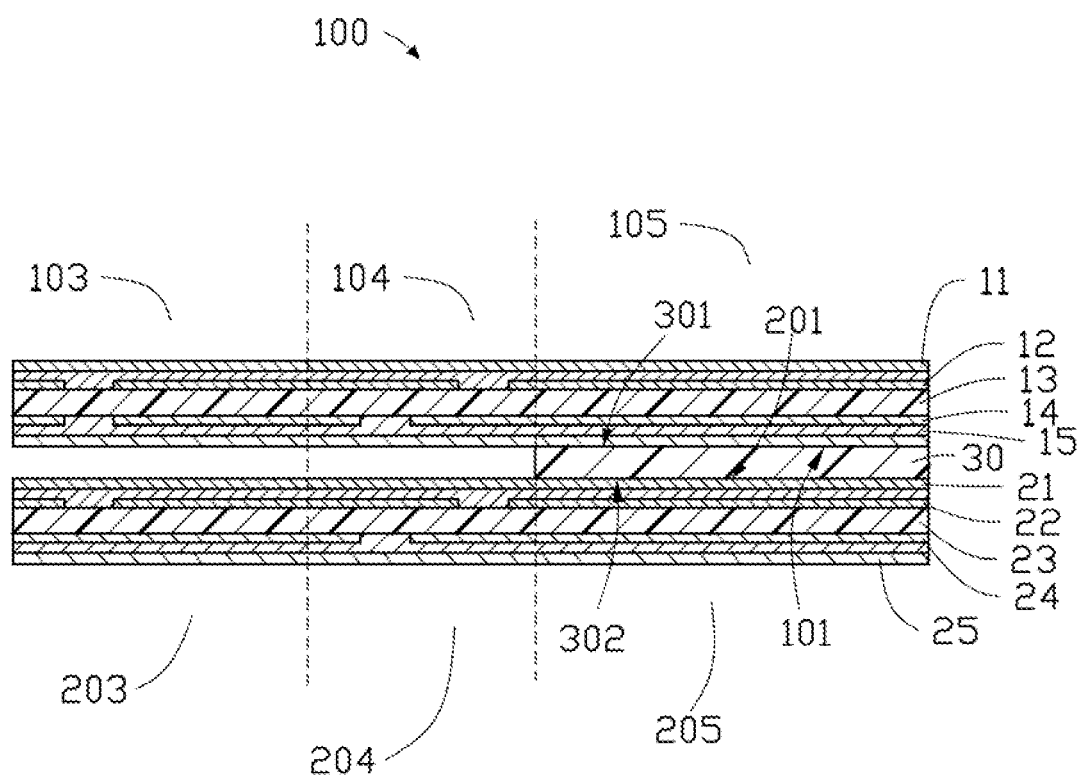
FIG. 3 shows a cross-sectional view of the first flexible PCB of FIG. 1 adhered with the second flexible PCB of FIG. 2 through a bonding sheet.

FIG. 3 illustrates that a bonding sheet 30 is provided, and the first flexible PCB 10 is adhered with the second flexible PCB 20 through the bonding sheet 30, therefore, forming an inner PCB 100.

The bonding sheet 30 includes a first surface 301 and a second surface 302 opposite to, and substantially parallel to, the first surface 301. The size of the bonding sheet 30 is equal to the size of the third portion 105 and the sixth portion 205, that is, the size of the bonding sheet 30 is less than that of the first flexible PCB 10. The first surface 101 of the third portion 105, which is also a surface of the second cover layer 15, is adhered to the first surface 301 of the bonding sheet 30, and the first surface 201 of the sixth portion 205, which is also a surface of the third cover layer 21, is adhered to the second surface 302 of the bonding sheet 30. That is, the bonding sheet 30 is only adhered to the third portion 105 of the first flexible PCB 10 and the sixth portion 205 of the second flexible PCB 20. The fourth, fifth, and sixth portion 203, 204, 205 of the second flexible PCB 20 are respectively aligned with the first, second, and third portion 103, 104, 105 of the first flexible PCB 10. The first and second portion 103, 104 of the first flexible PCB 10 are respectively separated from the fourth and fifth portion 203, 204 of the second flexible PCB 20.

The bonding sheet 30 can be made of epoxy resin or acrylic resin.

Figure 4:
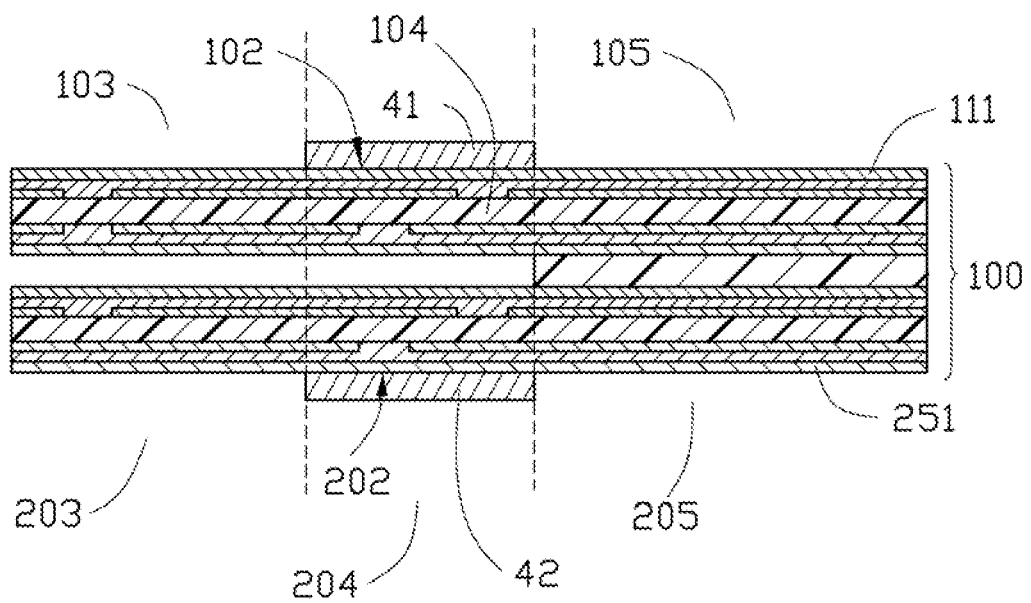
FIG. 4 shows a cross-sectional view of a first release film and a second release film respectively formed on the surfaces of the first flexible PCB and the second flexible PCB in FIG. 3.

FIG. 4 illustrates that a first release film 41 and a second release film 42 are provided, and the first release film 41 is located on the second surface 102 of the second portion 104, the second release film 42 is located on the second surface 202 of the fifth portion 204.

In this embodiment, the first release film 41 is located on a surface of the first film layer 111 away from the second flexible PCB 20, and the second release film 42 is located on a surface of the fourth film layer 251 away from the first flexible PCB 10.

The sizes of first release film 41 and the second release film 42 are all equal to the size of the second portion 104 and the fifth portion 204. The first release film 41 and the second release film 42 are all made of heat-stable resin such as heat-stable PET or polytetrafluoroethylene (PTEF). In another embodiment, the first release film 41 and the second release film 42 can made of metal sheet. In other embodiments, the first release film 41 and the second release film 42 can be omitted.

Figure 5:
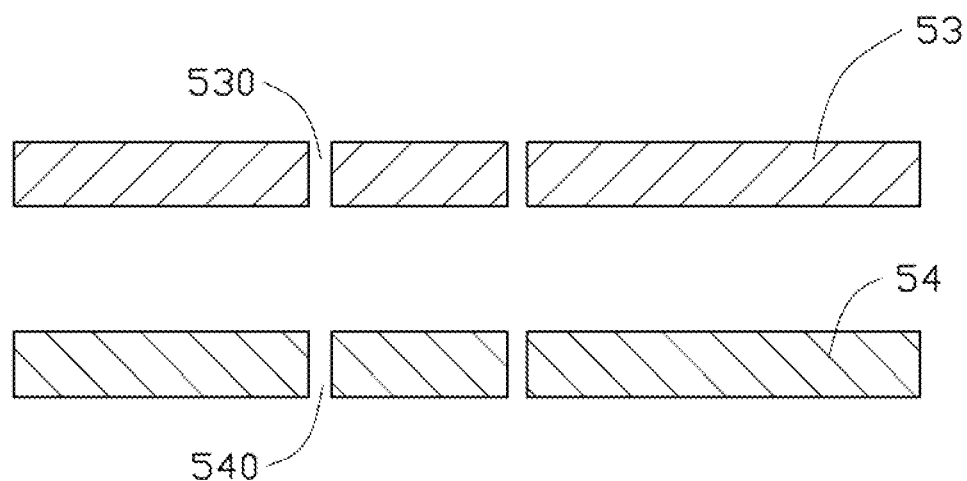
FIG. 5 shows a cross-sectional view of two prepreg sheets.
Figure 6:
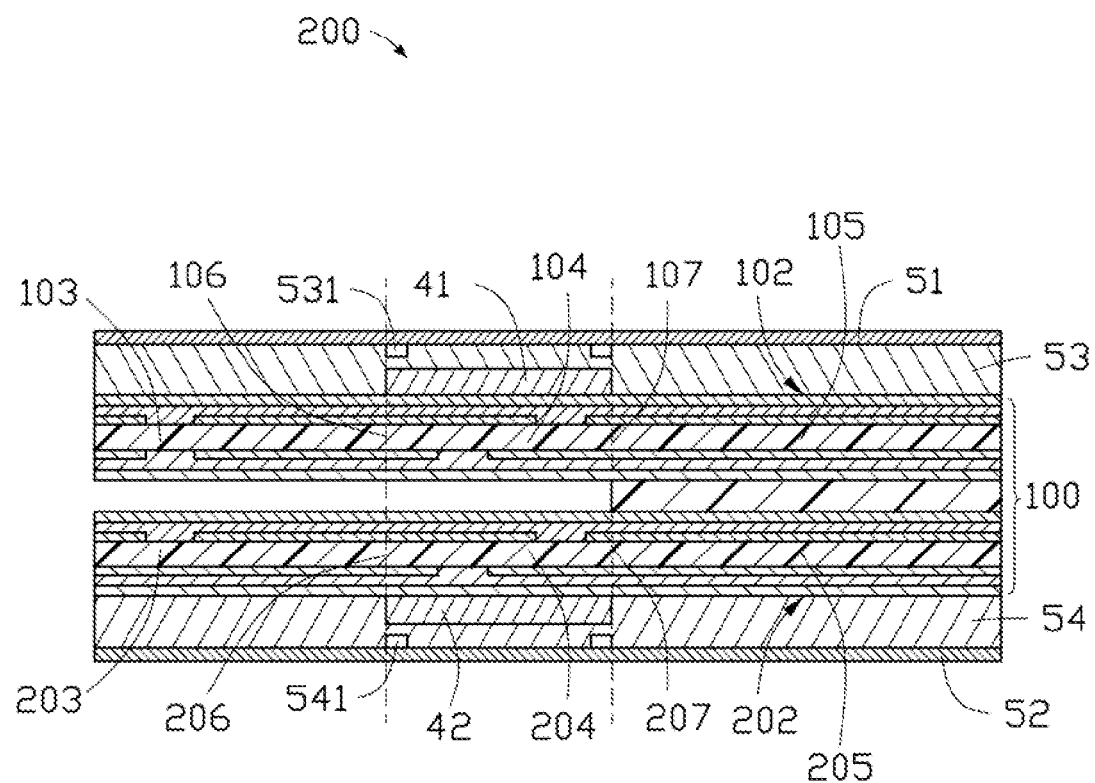
FIG. 6 shows cross-sectional view of a first copper foil and a second copper foil 52 respectively laminated on surfaces of the first flexible PCB and the second flexible PCB in FIG. 4 through the prepreg sheets in FIG. 5, to forming a printed circuit substrate.

FIGS. 5-6 illustrate that a first prepreg sheet 53, a second prepreg sheet 54, a first copper foil 51 and a second copper foil 52 are provided, and the first copper foil 51 and the second copper foil 52 are respectively laminated on two opposite surfaces of the inner PCB 100 through the first prepreg sheet 53 and the second prepreg sheet 54, therefore forming a printed circuit substrate 200.

In detail, firstly, the first prepreg sheet 53 is positioned on the second surface 102 of the first and the third portion 103, 105, and a surface of the first release film 41 away from the first flexible PCB 10. The second prepreg sheet 54 is positioned on the second surface 202 of the fourth and sixth portion 203, 205, and a surface of the second release film 42 away from the second flexible PCB 20. Then, the first copper foil 51 is positioned on a surface of the first prepreg sheet 53 away from the second surface 102 of the first flexible PCB 10, and the second copper foil 52 is positioned on a surface of the second prepreg sheet 54 away from the second surface 202 of the second flexible PCB 20. In this embodiment, sizes of the first prepreg sheet 53, the second prepreg sheet 54, the first copper foil 51 and the second copper foil 52 are all equal to the size of the first flexible PCB. Finally, the first copper foil 51, the first prepreg sheet, the first flexible PCB, the second prepreg sheet and the second copper foil 52 are laminated together. The first prepreg sheet 53 is adhered to the second surface 102 of the first and third portion 103, 105. The second prepreg sheet 54 is adhered to the second surface 202 of the fourth and sixth portion 203, 205. The first copper foil 51 and the second copper foil 52 are respectively adhered to the first prepreg sheet 53 and the second prepreg sheet 54. In other embodiments, the first prepreg sheet 53 and the second prepreg sheet 54 can defines openings aligned with the second portion 104, then, the first prepreg sheet 53 can just be positioned on the second surface of the first and the third portion, and the second prepreg sheet 54 can just be positioned on the second surface of the fourth and sixth portion.

The first prepreg sheet 53 defines two first grooves 530, and the second prepreg sheet 54 defines two second grooves 540. The first grooves 530 pass through the first prepreg sheet 53. The second grooves 540 pass through the second prepreg sheet 54. The two first grooves 530 are respectively corresponding to a boundary 106 of the first portion 103 and the second portion 104, and a boundary 107 of the second portion 104 and the third portion 105. The two second grooves 540 are respectively corresponding to a boundary 206 of the fourth portion 203 and the fifth portion 204, and a boundary 207 of the fifth portion 204 and the sixth portion 205. The first grooves 530 and the second grooves 540 can be formed by a mechanized cutting process or a laser cutting process.

The first grooves 530 are partly filled by the first prepreg sheet 53, and the second grooves 540 are partly filled by the second prepreg sheet 54 in the laminating process as illustrated in FIG. 6. A thickness of the first prepreg sheet 53 in each of the first grooves 530 is less than that of other portions of the first prepreg sheet 53, and the thickness of the second prepreg sheet 54 in each of the second grooves 540 is less than that of other portions of the second prepreg sheet 54, which makes it easy to cut the prepreg sheets along the grooves.

In other embodiments, the first groove 530 and the second groove 540 can be omitted.

Figure 7:
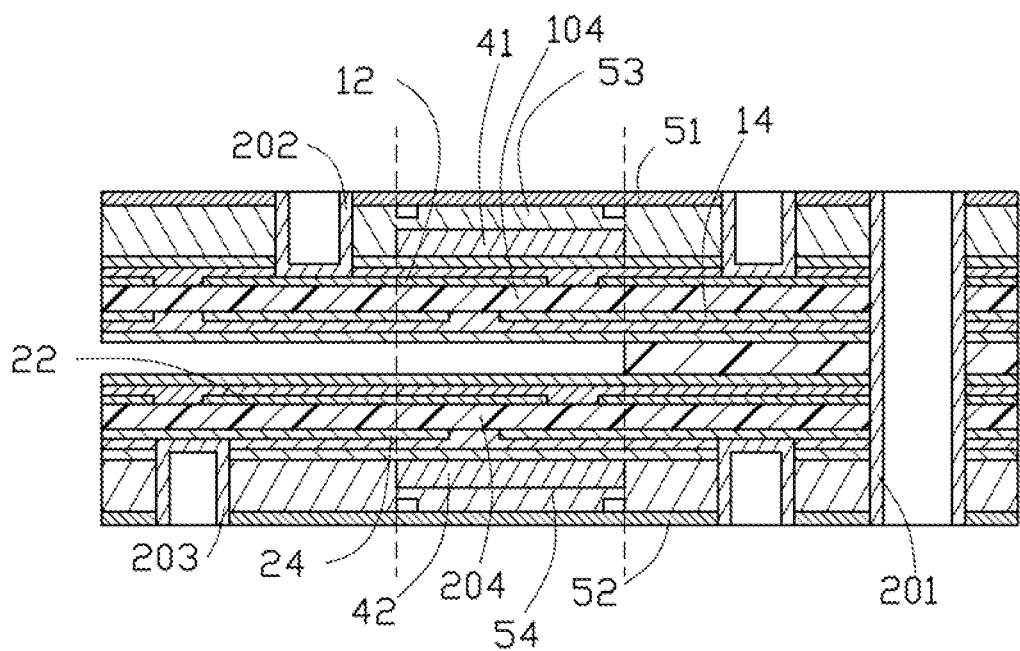
FIG. 7 shows a cross-sectional view of a plurality of conductive vias formed in the printed circuit substrate of FIG. 5.

FIG. 7 illustrates that a plurality of conductive vias are formed in the printed circuit substrate 200.

In this embodiment, the conductive vias includes at least one conductive through hole 201, at least one first conducive blind hole 202, and least one second conductive blind hole 203. The conductive through holes 201 electrically connect the first copper foil 51, the third conductive layer 12, the fourth conductive layer 14, and the second copper foil 52. The first conductive blind holes 202 electrically connect the first copper foil 51 and the third conductive layer 12. The second conductive blind holes 203 electrically connect the fourth conductive layer 14 and the second copper foil 52.

The conductive through holes 201 can be formed by a mechanized drilling process and then an electric plating process. The first conducive blind holes 202 and the second conducive blind holes 203 can be formed by a laser drilling process and then an electric plating process. In other embodiments, conductive layers can be formed on surfaces of the first copper foil 51 and the second copper foil 52 in the electric plating process.

Figure 8:
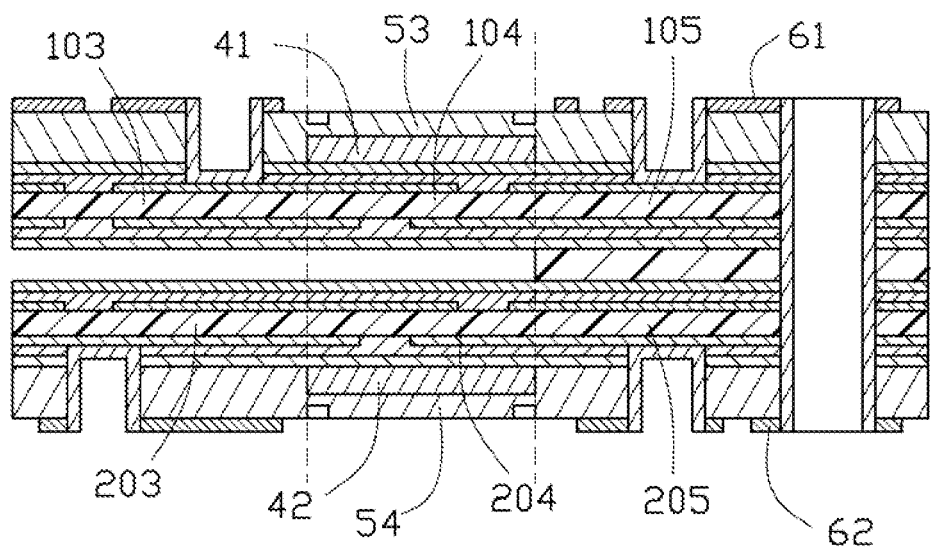
FIG. 8 shows a cross-sectional view of conductive layers formed on the printed circuit substrate in FIG. 7.

FIG. 8 illustrates that a first conductive layer 61 is formed by selectively etching the first copper foil 51, and a second conductive layer 62 is formed by selectively etching the second copper foil 52.

In this embodiment, a portion of the first copper foil 51 aligned with the second portion 104 is removed by the etching process, and a portion of the second copper foil 52 aligned with the fifth portion 204 is also removed by the etching process. The conductive through holes 201 electrically connect the first conductive layer 61, the third conductive layer 12, the fourth conductive layer 14, and the second conductive layer 62. The first conductive blind holes 202 electrically connect the first conductive layer 61 and the third conductive layer 12. The second conductive blind holes 203 electrically connect the fourth conductive layer 14 and the second conductive layer 62. The first conductive layer 61 and the second conductive layer 62 can be formed by a photolithography process and an etching process.

In other embodiments, the copper foils in the second portion 120 also can be reserved.

Figure 9:
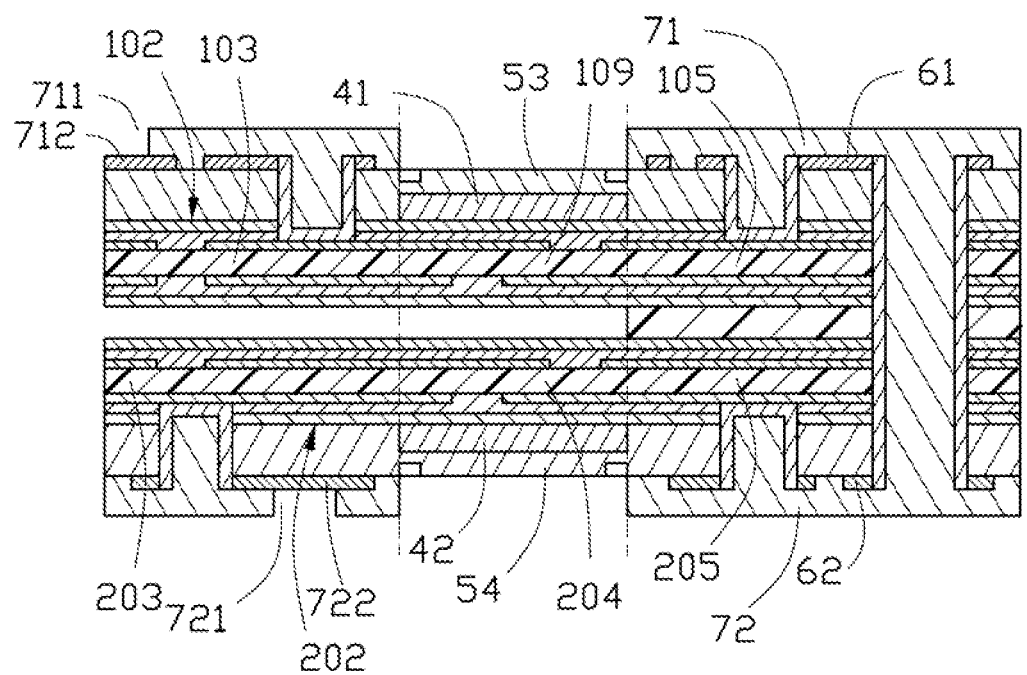
FIG. 9 shows a cross-sectional view of protective layers formed on surfaces of the conductive layers in FIG. 8.

FIG. 9 illustrates that a first protective layer 71 is formed on a surface of the first conductive layer 71 away from the first flexible PCB 10, and a second protective layer 72 is formed on a surface of the second conductive layer 72 away from the second flexible PCB 20.

In this embodiment, a first opening 711 is defined in the first protective layer 71. The first opening 711 directly faces the second surface 102 of the first portion 103. An area of a shadow of the first opening 711 on the second surface 102 of the first portion 103 is less than an area of the second surface 102 of the first portion 103. A portion of the first conductive layer 61 is exposed from the first opening 711. The exposed portion of the first conductive layer 61 is a first contact pad 712 for mounting an electronic component or PCB. A second opening 721 is defined in the second protective layer 72. The second opening 721 directly faces the second surface 202 of the fourth portion 203. An area of a shadow of the second opening 721 on the second surface 202 of the fourth portion 203 is less than an area of the second surface 202 of the fourth portion 203. A portion of the second conductive layer 62 is exposed from the second opening 721. The exposed portion of the second conductive layer 62 is a second contact pad 722 for mounting an electronic component or PCB. In other embodiments, the number of the first contact pads 712 and the number of the second contact pads 122 can be more than one. Contact pads can also be defined to be directly faces the second surfaces of the third portion 105 and the sixth portion 205.

In this embodiment, the first protective layer 71 and the second protective layer 72 can be made of solder resisting ink, and can be formed by a printing process.

Figure 10:
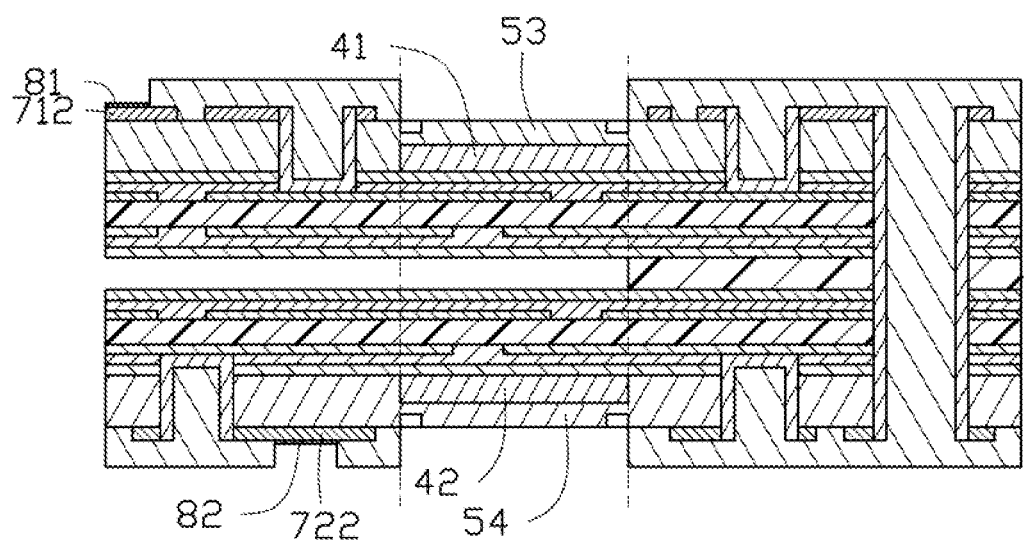
FIG. 10 shows a cross-sectional view of coating layers formed on surfaces of exposed conductive layers in FIG. 9.

FIG. 10 illustrates that a first coating layer 81 is formed on surfaces of the first contact pads 712, and a second coating layer 82 is formed on surfaces of the second contact pads 722.

In this embodiment, the first coating layer 81 and the second coating layer 82 are gold layers and are formed by an electric plating process. In other embodiments, the first coating layer 81 and the second coating layer 82 can be silver layers or organic solderability preservatives (OSP) layers.

Figure 11:
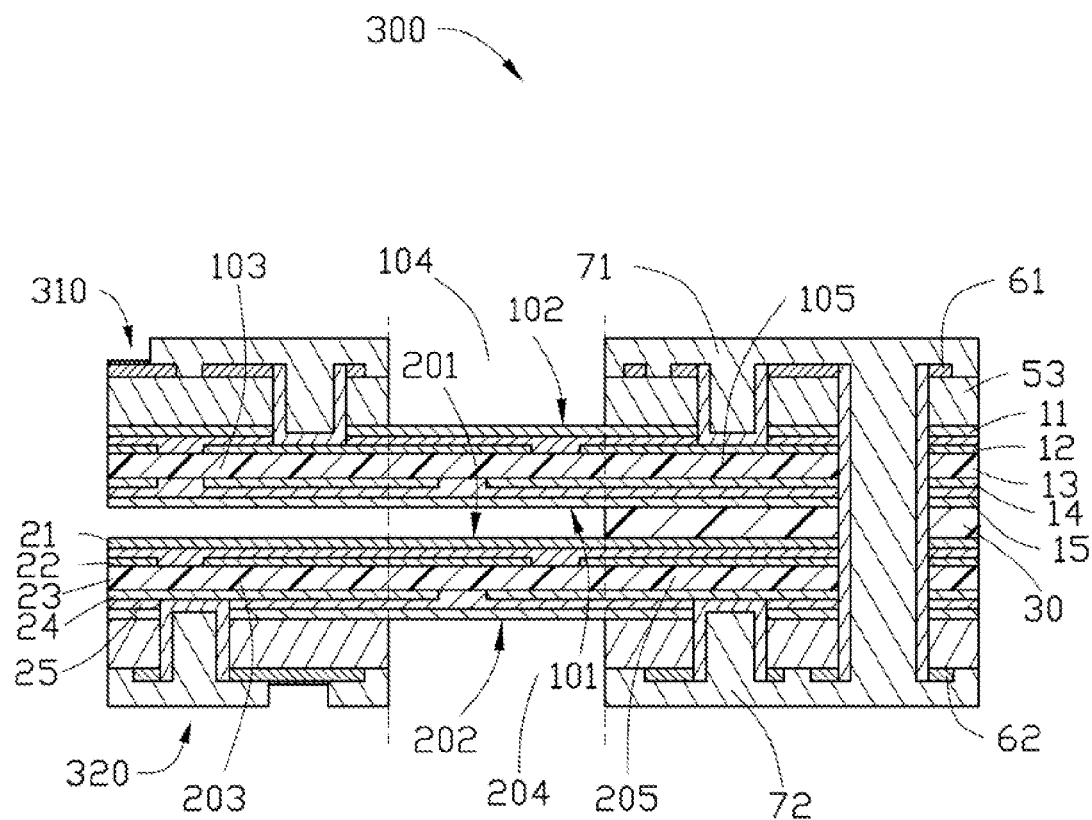
FIG. 11 a cross-sectional view showing removal of portions of the prepreg sheets in FIG. 10 to exposed the flexible area, to obtain a rigid-flexible PCB.

FIG. 11 illustrates that a portion of the first prepreg sheet 53 aligned with the second portion 104, a portion of the second prepreg sheet 54 aligned with the fifth portion 204, the first release film 41, and the second release film 42 are all removed, and the second portion 104 of the first flexible PCB 10 is exposed from the first prepreg sheet 53, and the fifth portion 204 of the second flexible PCB 20 is exposed from the second prepreg sheet 54, therefore forming a rigid-flexible PCB 300.

In this embodiment, the first prepreg sheet 53 and the second prepreg sheet 54 are removed by laser cutting along the grooves 530, 540. Then, the first release film 41 and the second release film 42 can be removed for there is no adherence with the rigid-flexible PCB 300.

In other embodiments, the first prepreg sheet 53 and the second prepreg sheet 54 can be removed by a mechanized cutting process.

The rigid-flexible PCB 300 includes a first conductive layer 61, a first prepreg sheet 53, a first flexible PCB 10, a bonding sheet 30, a second flexible PCB 20, a second prepreg sheet 54, and a second conductive layer 62 laminated in the described order.

The first flexible PCB 10 includes a first surface 101 and a second surface 102 opposite to, and substantially parallel to, the first surface 101. The first flexible PCB 10 defines a first portion 103, a second portion 104, and a third portion 105 connected in described order. In this embodiment, the first flexible PCB 10 includes a first cover layer 11, a third conductive layer 12, a first flexible insulating layer 13, a fourth conductive layer 14, and a second cover layer 15 adhered in the described order. The first surface 101 of the first flexible PCB 10 is a surface of the second cover layer 15 away from the first cover layer 11. The second surface 102 of the first flexible PCB 10 is a surface of the first cover layer 11 away from the second cover layer 15.

The second flexible PCB 20 includes a first surface 201 and a second surface 202 opposite to, and substantially parallel to, the first surface 201. The second flexible PCB 20 defines a fourth portion 203, a fifth portion 204, and a sixth portion 205 connected in described order. In this embodiment, the second flexible PCB 20 includes a third cover layer 21, a fifth conductive layer 22, a second flexible insulating layer 23, a sixth conductive layer 24, and a fourth cover layer 25 adhered in the described order. The second cover layer 15 of the first flexible PCB 10 is adhered with the third cover layer 21 of the second flexible PCB 20 through a bonding sheet 30. The first surface 201 of the second flexible PCB 20 is a surface of the third cover layer 21 away from the fourth cover layer 25. The second surface 202 of the second flexible PCB 20 is a surface of the fourth cover layer 25 away from the third cover layer 21. The size of the bonding sheet 30 is equal to the size of the third portion 105 and the sixth portion 205. The first surface 101 of the third portion 105 is adhered to the first surface 301 of the bonding sheet 30, and the first surface 201 of the sixth portion 205 is adhered to the second surface 302 of the bonding sheet 30. The first and second portion 103, 104 of the first flexible PCB 10 are respectively separated from the fourth and fifth portion 203, 204 of the second flexible PCB 20. The fourth, fifth, and sixth portion 203, 204, 205 of the second flexible PCB 20 are respectively aligned with the first, second, and third portion 103, 104, 105 of the first flexible PCB 10.

The first prepreg sheet 53 is adhered with the second surface 102 of the first and third portion 103, 105, and the second prepreg sheet 54 adhered with the second surface 202 of the fourth and sixth portion 203, 205. The first conductive layer 61 is formed on and adhered with a surface of the first prepreg sheet 53 away from the first flexible PCB 10, and the second conductive layer 62 is formed on and adhered with a surface of the second prepreg sheet 54 away from the second flexible PCB 20. The second portion 104 is exposed from the first prepreg sheets 53 and the first conductive layer 61, and the fifth portion 204 is exposed from the second prepreg sheets 54 and the second conductive layer 62. The second portion 104 and the fifth portion 204 are the flexible area of the rigid-flexible PCB 300. The first and second portion 103, 104 of the first flexible PCB 10 are respectively separated from the fourth and fifth portion 203, 204 of the second flexible PCB 20. The second and the fifth portion 104, 204 can be respectively flexed at a right angle, an acute angle, an obtuse angle, or 180 degrees.

The first portion 103, a portion of the first prepeg sheet 53 aligned with the first portion 103, and a portion of the first conductive layer 61 aligned with the first portion 103 are cooperatively defined to be a first mounting portion 310. The fourth portion 203, a portion of the second prepeg sheet 54 aligned with the fourth portion 203, and a portion of the second conductive layer 62 aligned with the fourth portion 203 are cooperatively defined to be a second mounting portion 320. The first mounting portion 310 and the second mounting portion 320 can respectively electrically connect elements, such as PCBs, or electronic components.

The rigid-flexible PCB 300 further includes a first protective layer 71 formed on a surface of the first conductive layer 71 away from the first flexible PCB 10, and a second protective layer 72 formed on a surface of the second conductive layer 72 away from the second flexible PCB 20.

Figure 12:
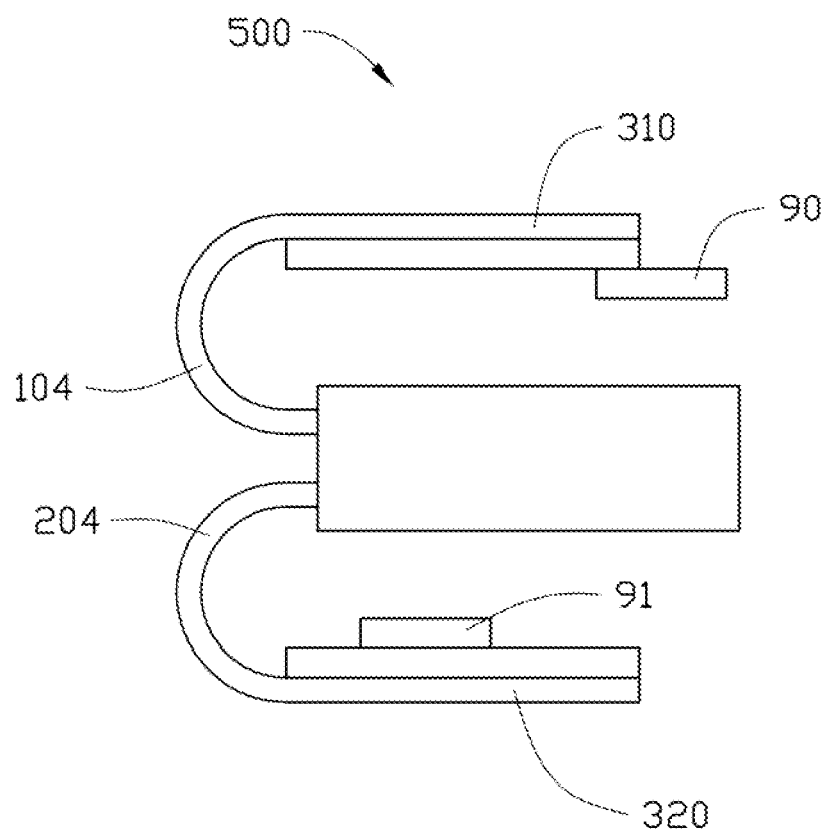
FIG. 12 shows a schematic view of a PCB and an electronic component being mounted on the surfaces of the coating layers in FIG. 11.

FIGS. 11-12 illustrate that an electronic component 91 is mounted on a surface of the second contact pad 722, and a PCB 90 is mounted on a surface of the first contact pad 712, therefore forming a PCB module 500.

In this embodiment, the first mounting portion 310 is moved to face the third portion 105 by flexing the first flexible portion 330 to about 180 degrees, and the second mounting portion 320 is moved to face the sixth portion 205 by flexing the second flexible portion 340 to about 180 degrees. The first mounting portion 310 electrically connects a PCB 90, and the second mounting portion 320 electrically connects an electronic component 91, therefore forming the PCB module 500.

In other embodiments, the rigid-flexible PCB 300 aligned with the third portion 105 and the sixth portion 205 can also electrically connect PCBs, or electronic components, that is, the rigid-flexible PCB 300 can have two or three mounting portions to electrically connect PCBs, or electronic components.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing a rigid-flexible printed circuit board (PCB), comprising:

providing a first flexible PCB and a second flexible PCB, the first flexible PCB having a first surface and a second surface opposite to, and substantially parallel to, the first surface, the second flexible PCB having a first surface and a second surface opposite to, and substantially parallel to, the first surface, the first flexible PCB defining a first portion, a second portion, and a third portion connected in described order, the second flexible PCB defining a fourth portion, a fifth portion, and a sixth portion connected in described order;

providing a bonding sheet having a first surface and a second surface opposite to, and substantially parallel to, the first surface;

adhering the first surface of the third portion to the first surface of the bonding sheet, and adhering the first surface of the sixth portion to the second surface of the bonding sheet, the fourth, fifth, and sixth portion of the second flexible PCB being respectively aligned with the first, second, and third portion of the first flexible PCB; and forming a first prepreg sheet and a first conductive layer on the second surface of the first and third portion, and forming a second prepreg sheet and a second conductive layer on the second surface of the fourth and sixth portion, the first prepreg sheet being adhered with the second surface of the first and third portion, the second prepreg sheet being adhered with the second surface of the fourth and sixth portion, the first conductive layers being adhered with a surface of the first prepreg sheet away from the first flexible PCB, the second conductive layers being adhered with a surface of the second prepreg sheet away from the second flexible PCB, thereby, obtaining a rigid-flexible PCB;

wherein the first and second portion of the first flexible PCB are separated from the fourth and fifth portion of the second flexible PCB.

2. The method of claim 1, wherein a method for forming the prepreg sheets and conductive layers comprises:

providing the first prepreg sheet and the second prepreg sheet, the first prepreg sheet defining an opening aligned with the second portion, and the second prepreg sheet defining an opening aligned with the fifth portion;

positioning the first prepreg sheet on the second surface of the first and the third portion, positioning the second prepreg sheet on the second surface of the fourth and sixth portion;

providing a first copper foil and a second copper foil, positioning the first copper foil on a side of the first prepreg sheet away from the second surface of the first flexible PCB, positioning the second copper foil on a side of the second prepreg sheet away from the second surface of the second flexible PCB;

laminating the first copper foil, the first prepreg sheet, the first flexible PCB, the bonding sheet, the second flexible PCB, the second prepreg sheet and the second copper foil together; and selectively etching the first copper foil to form the first conductive layer, selectively etching the second copper foil to form the second conductive layer, and a portion of the first copper foil aligned with the second portion and a portion of the second copper foil aligned with the fifth portion being removed by the etching process.

3. The method of claim 1, wherein a method for forming the prepreg sheets and conductive layers comprises:

providing a first release film and a second release film, positioning the first release film on the second surface of the second portion, positioning the second release film on the second surface of the fifth portion;

providing a first prepreg sheet and a second prepreg sheet, positioning the first prepreg sheet on the second surface side of the first flexible PCB, the first prepreg sheet covering the second surface of the first and third portion, and a surface of the first release film away from the first flexible PCB, positioning the second prepreg sheet on the second surface side of the second flexible PCB, the second prepreg sheet covering the second surface of the fourth and sixth portion, and a surface of the second release film away from the second flexible PCB;

providing a first copper foil and a second copper foil, positioning the first copper foil on a surface of the first prepreg sheet away from the second surface of the first flexible PCB, positioning the second copper foil on a surface of the second prepreg sheet away from the second surface of the second flexible PCB;

laminating the first copper foil, the first prepreg sheet, the first flexible PCB, the bonding sheet, the second flexible PCB, the second prepreg sheet and the second copper foil together;

selectively etching the first copper foil to form the first conductive layer, and selectively etching the second copper foil to form the second conductive layer, a portion of the first copper foil aligned with the second portion and a portion fo the second copper foil aligned with the fifth portion being removed by the etching process;

a portion of the first prepreg sheet aligned with the second portion being removed to expose the first flexible PCBs, and a portion of the second prepreg sheet aligned with the fifth portion being removed to expose the second flexible PCBs; and the first release film and the second release film being removed.

4. The method of claim 3, wherein the first prepreg sheet is removed by laser cutting the first prepreg sheet along a boundary of the first portion and the second portion and a boundary of the second portion and the third portion, the second prepreg sheet is removed by laser cutting the first prepreg sheet along a boundary of the fourth portion and the fifth portion and a boundary of the fifth portion and the sixth portion.

5. The method of claim 4, wherein the first prepreg sheet defines two first grooves, the first grooves pass through the first prepreg sheet, the second prepreg sheet defines two second groove, the second grooves pass through the second prepreg sheet, the two first grooves are respectively corresponding to the boundary of the first portion and the second portion, and the boundary of the second portion and the third portion, and the two second grooves are respectively corresponding to the boundary of the fourth portion and the fifth portion, and the boundary of the fifth portion and the sixth portion; the first groove are partly filled by the first prepreg sheet, and the second groove are partly filled by the second prepreg sheet in the laminating process, therefore, a thickness of the first prepreg sheet in each of the first groove is less than that of other portions of the first prepreg sheet, and a thickness of the second prepreg sheet in each of the second groove is less than that of other portions of the second prepreg sheet.

6. The method of claim 1, further comprising respectively forming protective layers on surfaces of the conductive layers.

7. The method of claim 6, wherein at least one opening is defined in each of the protective layers, and portions of the conductive layers exposed from the openings are contact pads, the contact pads are configured to electrically connect PCBs, or electronic components.

\* \* \* \* \*